United States Patent [19]

Welch et al.

[11] 4,121,204
[45] Oct. 17, 1978

[54] BAR GRAPH TYPE TOUCH SWITCH AND DISPLAY DEVICE

[75] Inventors: Stanley B. Welch; Juan de J. Serrano; David Y. Chen, all of Louisville, Ky.

[73] Assignee: General Electric Company, Louisville, Ky.

[21] Appl. No.: 750,559

[22] Filed: Dec. 14, 1976

[51] Int. Cl.² .............................................. G08B 5/36
[52] U.S. Cl. ................... 340/337; 200/5 A; 307/116; 340/365 C; 361/181; 219/453
[58] Field of Search ............. 340/337, 365 C, 378 R; 361/288, 181; 307/116; 200/5 A

[56] References Cited

U.S. PATENT DOCUMENTS

| | | | |
|---|---|---|---|
| 1,106,907 | 8/1914 | Wilkinson | 200/189 |
| 3,064,091 | 11/1962 | Turner | 200/5 R |
| 3,217,307 | 11/1965 | Fogelquist | 340/188 R |
| 3,701,869 | 10/1972 | Jacob et al. | 200/308 |
| 3,835,465 | 9/1974 | Tannas et al. | 340/378 R |
| 3,851,328 | 11/1974 | Sottile et al. | 340/337 |
| 3,886,539 | 5/1975 | Gould | 340/337 |
| 3,895,288 | 7/1975 | Lampen et al. | 323/94 R |
| 3,967,158 | 6/1976 | Saxon | 340/324 R |
| 3,968,467 | 7/1976 | Lampen et al. | 338/119 |

Primary Examiner—David L. Trafton
Attorney, Agent, or Firm—Frederick P. Weidner

[57] ABSTRACT

A user input/output device comprises a lighted, segmented bar graph type display and an array of light transmitting touch sensitive areas superimposed over the bar graph display. A suitable circuit means is responsive to the touch sensitive areas and connected for driving the segments of the bar graph such that when any one of the touch sensitive areas is touched, a corresponding display segment and all display segments to one side are energized and the remaining display elements are de-energized.

4 Claims, 10 Drawing Figures

BAR GRAPH TYPE TOUCH SWITCH AND DISPLAY DEVICE

BACKGROUND OF THE INVENTION

The present invention relates generally to a user input and display device for controlling a range or the like and, more particularly, to such a device which is easily understandable by the user.

In a user operable control for an appliance, for example, a range surface unit heat control or a microwave oven power level control, it is highly desirable that each operation of the control result in an immediate indication to the user in an easily understood manner that the desired control function has in fact been selected. Additionally, the user should at any time be able to ascertain at a glance the state of the controls, i.e., the last control operation. Of course, the control must also send a signal to the rest of the apparatus or appliance to cause the selected function to actually occur.

Conventional mechanical switches, for example push button switches or rotary switches, although suffering certain limitations due to their mechanical nature, do serve well the function of indicating to the user just what has been selected. For example, in a range surface unit heat control comprising a row of pushbuttons arranged from low to high heat settings, the user pushes any one of the pushbuttons to select a desired heat setting. Additionally, by observing which of the pushbuttons is down, the user has immediate visual feedback as to the selection. Some controls of this general pushbutton type have included indicating lamps disposed beneath transparent pushbuttons and connected such that the pushbutton which is depressed lights up. Another type of mechanical switch conventionally used for such controls is simply a rotary switch having specific marked heat-setting positions.

With the recent development of so-called "electronic" appliances, particularly consumer microwave ovens but also conventional ranges, touch control and electronic display techniques have been adapted for use therein. One reason for this is the convenient interface of these electronic type inputs and display outputs with other electronic circuitry required in the appliance. Furthermore, such techniques make it possible to have a smooth control panel surface for good appearance and easy cleaning and eliminating reliability problems caused by mechanically movable switch contacts. Mechanically movable switch contacts, while generally capable of many years of trouble-free service, do eventually wear out simply because they employ moving parts. So-called touch switches do not employ moving parts but sense merely the presence of a human touch by sensing, for example, either a resistive bridging effect or a capacitive effect associated with a human touch.

The present invention advantageously combines touch switch user-input technology and bar graph display output technology to provide a simple and readily-understandable input/output device. The device permits the construction of an unintimidating control panel which a person may use with confidence. Further, it is fully compatible with digital logic control systems.

SUMMARY OF THE INVENTION

Accordingly, it is an object of the invention to provide a touch switch and display device which is readily understandable by a user with a minimum or even no instruction.

It is another object of the invention to provide such an input/output device which readily interfaces to electronic circuitry.

It is another object of the invention to provide such an input/output device which includes a bar graph type display which provides an indication at a glance of a selected quantity.

These and other objects are accomplished by the invention which includes a linear array of display segments strung out and adapted to be progressively energized to form a bar graph type display. A linear array of touch sensitive areas is superimposed over the linear array of display segments. Further, there is included any suitable circuit means responsive to the touch sensitive areas and connected for driving the display elements such that when any one of the touch sensitive areas is touched, a corresponding display segment and all display segments to one side are energized and the remaining display elements are de-energized.

The result is an input/output device which appears strikingly simple to the user and which is inherently understandable without instruction. The lighted bar graph display actually "follows" the tip of the user's finger in a unique and pleasing manner. The lighted bar graph display continuously indicates the power level or heat setting selected and the touch switch feature permits convenient changes to the setting with immediate reinforcing visual feedback to the user.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description taken in conjunction with the drawings, in which:

DESCRIPTION OF THE PREFERRED EMBODIMENT

Figure 1:
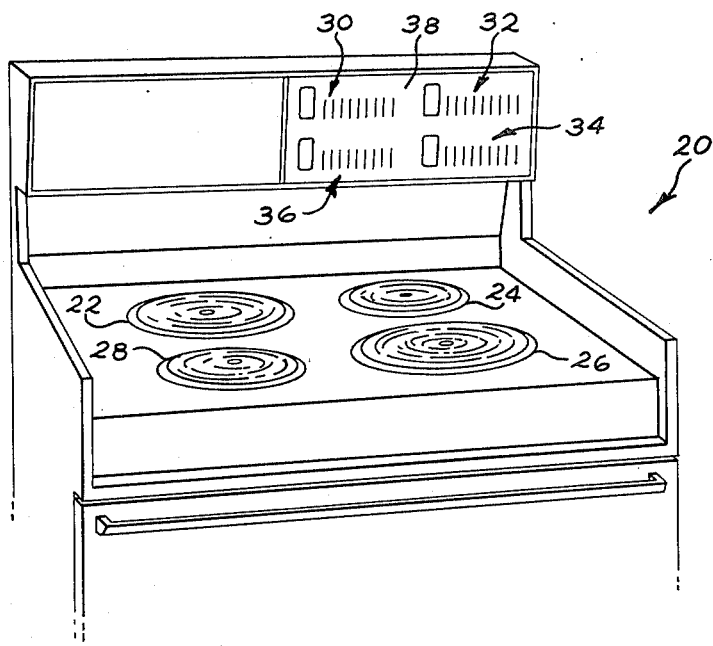
FIG. 1 is a front perspective view of a portion of an electric range including input/output devices according to the present invention employed as surface unit heat controls.

Referring first to FIG. 1, an electric range 20 includes four conventional electric surface heating units 22, 24, 26 and 28. To provide user control over the heat produced by the surface heating units, four corresponding input/output devices 30, 32, 34 and 36 contemplated by the present invention are disposed upon the right hand portion of the range control panel 38. The control panel 38 is formed of any suitable dielectric material, but preferably is glass for best appearance and cleanability. As will be apparent from the physical arrangement of the devices 30, 32, 34 and 36, the upper left input/output device 30 controls the left rear surface heating unit 22, the upper right input/output device 32 controls the right rear surface heating unit 24, and so on.

Figure 2:
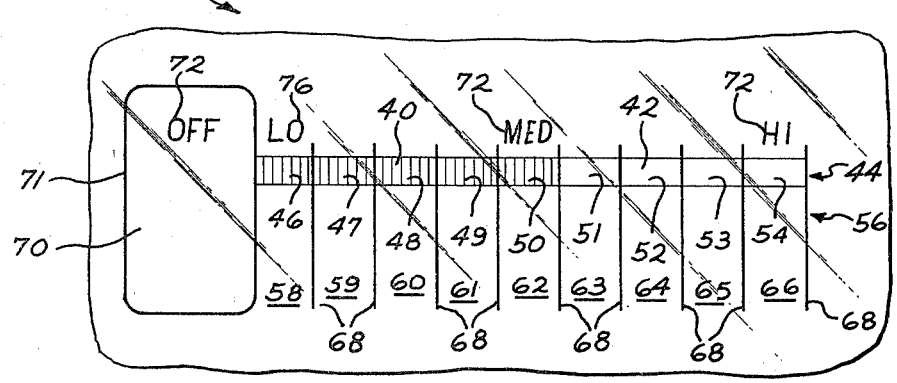
FIG. 2 is a greatly enlarged view of a single one of the input/output devices of FIG. 1 as it appears to the user when a "medium" heat setting has been selected.

Referring now to FIG. 2, there is shown a greatly enlarged view of representative input/output device 30 as it appears to the user when a "medium" heat setting for the left rear surface heating unit 22 has been selected. To indicate to the user what heat setting has been selected, a lighted bar graph display 40 is visible through a suitable transparent window 42 in the panel 38. The illustrated bar graph display 40 employs a red light bar, as illustrated by the symbolic red shading. The bar graph display 40 actually comprises a linear array 44 of individual display segments 46 through 54 which are strung out such that each segment is adjacent to no more than two other segments. The segments are adapted to be progressively energized to form the bar graph type display 40 to represent a numerical quantity.

In order to provide user input to the device 30, a linear array 56 of light transmitting touch sensitive areas 58 through 66 is superimposed over the array 44 of display segments. The individual touch sensitive areas 58 through 66 are delineated by lines 68, which may simply be painted on the surface of the control panel 38. Due to difficulty in constructing an operable touch sensitive area which also is small, as shown in FIG. 2, the totality of each touch sensitive area is larger than the corresponding display segment. To provide a means for turning the surface heating unit 22 completely off, an "OFF" touch sensitive area 70 is positioned at the extreme left hand side of the display segment array 44 and the touch area array 56, the "OFF" touch sensitive area being delineated by a rectangular painted line 71. Since no corresponding display segment is associated with the "OFF" touch sensitive area, it may or may not be transparent. Finally, a legend 72 in the form of "OFF," "LO," "MED," and "HI" symbols is applied to the control panel 38.

In order for the device 30 to operate, it includes suitable circuit means 74 (FIG. 4), hereinafter described in greater detail. The circuit means 74 may be any suitable circuitry which is responsive to the touch sensitive areas 58 to 66 and which is connected for driving the display segments 46 through 54. To produce a lighted bar graph type display, when any one of the individual touch sensitive areas 58 through 66 is touched, the circuit means 74 operates to energize the corresponding individual display segment, along with all display segments to one side, preferably the left or "LO" side. The remaining display segments to the right are de-energized. It will be apparent to those skilled in the art of circuit design that many different circuits may be devised to accomplish these objectives. While particular circuitry is hereinafter described, the present invention is not limited to any particular circuit. It will further be apparent to those skilled in the art, that instead of discrete circuitry, a microprocessor-based computer and associated stored program may readily be employed to receive inputs from and operate the device 30, and the term "circuit means" as used herein is intended to include such an arrangement.

Figure 3:
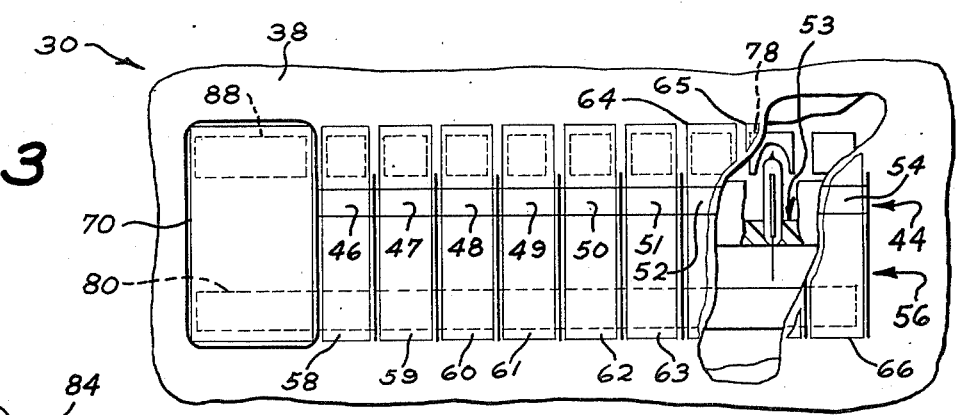
FIG. 3 is a view similar to FIG. 2, but showing details of construction not ordinarily visible to the user.
Figure 4:
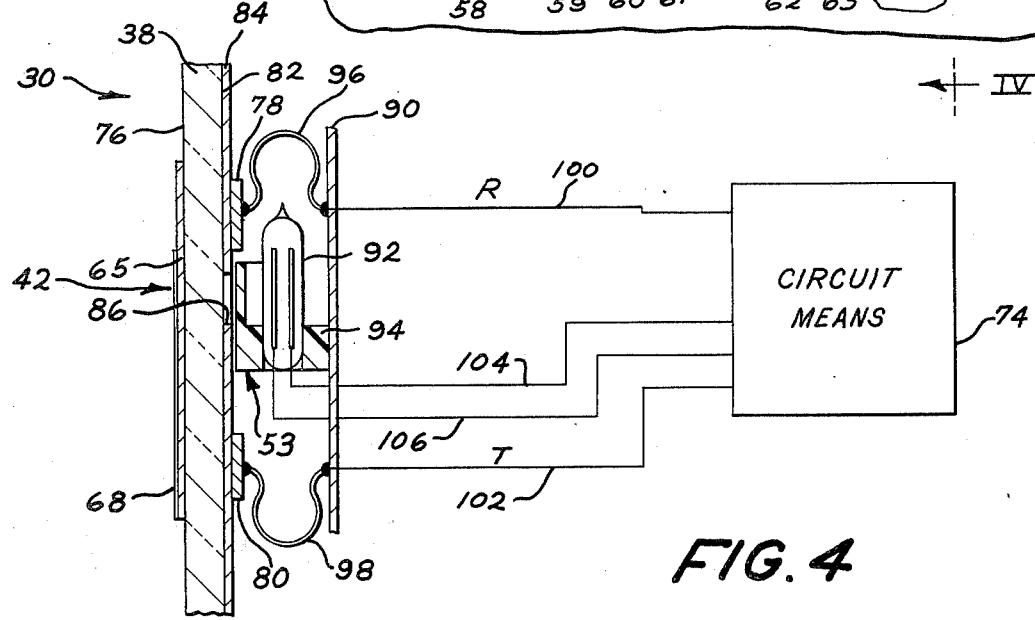
FIG. 4 is a sectional view taken along line IV—IV of FIG. 3 and further showing a block schematic representation of circuit means forming a part of a complete device.

Turning now to FIGS. 3 and 4 for a description of the underlying constructional details of the representative input/output device 30, each of the touch sensitive areas 58 through 66 is the touch pad associated with a conventional capacitive attenuator type touch switch. Referring in particular to FIG. 4 for a detailed cross-sectional view of the touch sensitive area 65 located near the "HI" end of the device 30, the touch sensitive area 65 comprises a thin, conductive, light-transmitting layer deposited on the front surface 76 of the panel 38. The touch pad 65 may be formed of any material which can be metallized or deposited on the front surface 76 in a sufficiently thin layer so as to be sufficiently transparent. One example of a suitable conductive material is tin oxide. It will be apparent that the touch pad 65 is, for convenience, illustrated with greatly exaggerated thickness. Since the panel 38 and the touch pad 65 are both light-transmitting, the display segment 53 disposed beneath the panel 38 is readily visible through the transparent window 42 and the touch pad 65 when energized. To form a complete touch switch, transmitter and receiver pads 78 and 80 are disposed on the rear side 82 of the panel 38, opposite the touch pad 65. Each of the rear pads 78 and 80 thereby forms a capacitor with the touch pad 65, the panel 38 serving as the capacitor dielectric. In the particular arrangement illustrated, the rear pads 78 and 80 need not be transparent and therefore may be made of any suitable conductive material, such as metallic copper or silver. However, it will be appreciated that in other arrangements the rear pads 78 and 80 may also be transparent. In order to conceal the rear pads 78 and 80 from view for a pleasing appearance, a layer of black paint 84 is applied to the rear side of the panel 82, underneath the rear pads 78 and 80, the window 42 being defined by a suitable break 86 in the paint layer 84. Additionally, there is visible in FIG. 4, also in exaggerated thickness, a portion of one of the painted lines 68 applied to the panel front side 76, the painted line 68 being slightly thicker than the touch pad 65 and therefore visible in the FIG. 4 sectional view.

The conductive touch pads forming the touch sensitive areas are not readily visible to a casual observer; however, upon close examination, they may be discerned. FIG. 3 thus shows the outline of each touch pad in the touch area array 56 in light lines. FIG. 3 additionally shows, in dash lines, the outlines of the receiver pads, corresponding to the receiver pad 78, disposed on the rear side of the panel below a portion of each of the touch sensitive areas 58 through 66. Additionally, a single transmitter pad 80 is shown in dashed lines extending below each of the touch sensitive areas 58 through 66. The particular circuit means 74 is arranged so as to permit the use of a common transmitter pad. The "OFF" touch switch is constructed similarly, except that the touch pad need not be transparent. The "OFF" touch sensitive area 70 is also the touch pad associated with a conventional capacitive touch switch and has associated therewith a rear receiver pad 88 and shares the transmitter pad 80 in common with the touch sensitive areas 58 through 66.

Referring now particularly to FIG. 4 for details of the display segment 53 and the mounting thereof, a subpanel 90 is formed of any conventional printed circuit board material and spaced a suitable distance from the rear side 82 of the front panel 38. The display segment 53 is mounted to the subpanel 90 and oriented so as to be visible through the window 42 when energized. The display segment 53 comprises a neon lamp 92 mounted in a red plastic light-dispersing lens element 94. The plastic lens element 94 preferably is rectangular when viewed from the front thereof, and has suitable light-scattering surface roughness so as to produce a solid block of light when the neon bulb 92 is energized. By placing the individual display segments of the array 44 in side by side relationship, it will be apparent that a lighted bar graph is formed. In order to provide electrical connections to the representative receiver transmitter pad 78 and to the common transmitter pad 80, spring contact clips 96 and 98 bridge between the subpanel 90 and the pads 78 and 80. The spring contact clips 96 and 98 are connected through "R" and "T" conductors (for Receiver and Transmitter) 100 and 102 to the circuit means 74. Additionally, conductors 104 and 106 connect the circuit means 74 to the electrodes of the neon lamp 92.

While a particular construction is illustrated, it will be apparent that the array 44 of display segments may take any one of a number of different forms. Some examples for devices which may make up individual segments are: light emitting diodes (LED's); gaseous discharge displays; incandescent lamps, liquid crystal displays (LCD's); and so on. In a similar vein, while a capacitive attenuator type touch switch is illustrated, other types of touch switches are known and may be employed. Furthermore, the array 44 of display segments and the array 56 of touch sensitive areas need not be completely separate devices, but may be partially combined. For example, there are known prior art devices combining a touch switch and an indicator in the same device. Such a device may comprise a cold cathode gas discharge tube including a conductive button or "nesa" spot on the surface of the glass tube. When the "nesa" spot is touched, body capacitance causes a change in the electric field within the gas discharge tube, causing it to conduct. The conduction may be used to signal other circuitry that the spot has been touched and additionally, the resulting visible ionization of the gas provides an indication to the user.

In the operation of the touch switch and display device 30, when a user touches any portion of the array 56 of touch sensitive areas, the circuit means 74 responds to properly drive the display array 44 to form a bar graph and additionally sends suitable signals to external circuitry (not shown) to cause the appropriate control function, for example heat setting, to be accomplished.

For example, if the user touches the area corresponding to medium, the "MED" display segment 50 and all display segments to the left are energized, and all display segments to the right are de-energized, as shown in FIG. 2. If the user moves his finger or touches an area farther to the left, then all the display segments to the right of where he has touched go out and the remaining segments remain on. Similarly, if the user touches a touch area farther to the right, additional display segments are energized. It will be apparent therefore that a highly graphic input and display device results.

Figure 5:
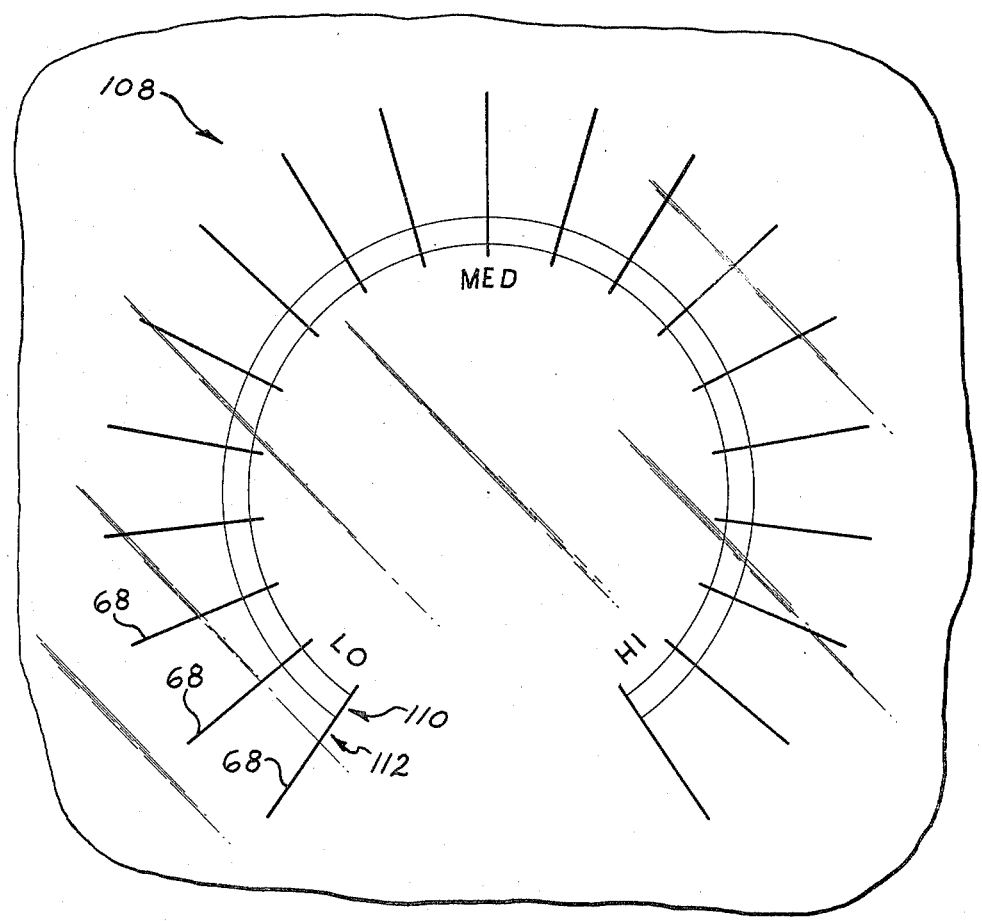
FIG. 5 is a view comparable to FIG. 2 showing an input/output device employing a cicular bar graph display as it appears to the user.

Referring now to FIG. 5, there is illustrated another embodiment of an input/output device 108 according to the present invention, in which a linear array 110 of display segments is arranged in a circular configuration, with a linear array 112 of touch sensitive areas superimposed thereover. Other than having a circular as opposed to a straight line configuration, the device 108 of FIG. 5 is similar to the device 30 of FIGS. 2 through 4.

The operation of the device 108 of FIG. 5 is essentially identical to the operation of the previously described device 30, with the exception that the bar of light formed comprises segments of a circular bar graph as opposed to a straight line bar graph.

With reference to the requirements of particular circuit means which may be employed, it will be apparent that, due to the persistance of human vision, each individual energized display segment need not remain continuously illuminated, but the display may be multiplexed, the individual display elements being rapidly strobed one at a time. As is well known, so long as each segment which is energized is energized at least approximately 16 times per second, to the human eye, it appears to be continuously energized. Therefore, the present invention is not intended to be limited to a continuously energized display system but is intended to include such a multiplexed display. As is well known to those skilled in the art, the use of such a multiplexing arrangement permits a significant reduction in the number of wired connections between the circuitry display.

What follows is a description of exemplary circuitry which may be used to accomplish the necessary functions to operate either of the embodiments described above with reference to FIGS. 1 through 5. As previously stated, it will be apparent that many configurations of such circuit means are possible, and the description herein of particular means is intended to be exemplary only to enable one skilled in the art to practice the invention with a minimum of experimentation, and is not intended to limit the scope of the claimed invention. For convenience of description, the circuitry will be described with particular reference to the device 30 illustrated in FIGS. 1 through 4, but it will be apparent that it applies, with obvious modifications, to the device 108 of FIG. 5 as well.

Figure 6:
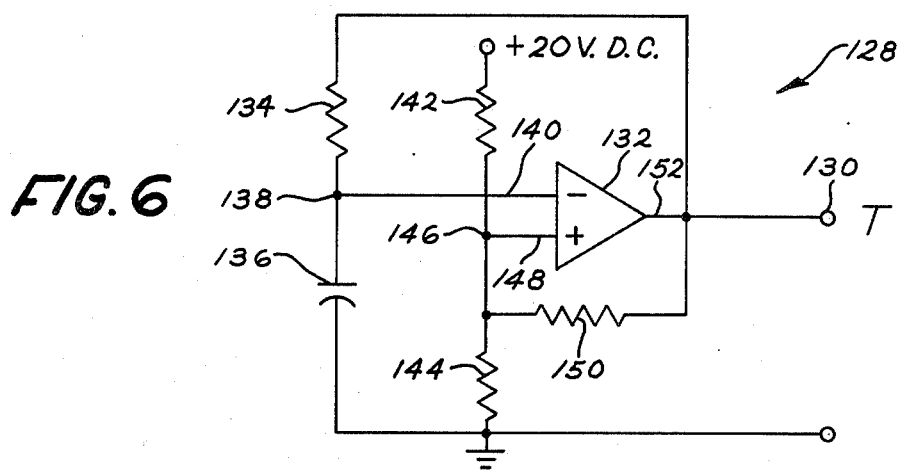
FIG. 6 is a schematic circuit diagram of a transmitter which may be used to drive the touch switch portion of a device according to the present invention.

Considering first circuitry to operate the various touch switch devices forming the array, in FIG. 6 there is illustrated circuitry of a "transmitter" 128 which is simply a free-running 33 KHz square wave oscillator producing its output at a "T" terminal 130. The "T" terminal 130 is connected through the conductor 102 to the common transmitter pad 80 of the device 30 (FIG. 4). An operational amplifier 132 is the active device in the transmitter 128. To establish the 33 KHz oscillation frequency, an RC timing network comprising a resistor 134 and a capacitor 136 has its junction 138 connected to the inverting input 140 of the operational amplifier 132. A resistive voltage divider comprising equal-valued resistors 142 and 144 is connected between a 20 volt D.C. source and circuit ground, with the tap point 146 connected to the non-inverting input 148. Lastly, a positive feedback resistor 150 is connected between the operational amplifier output 152 and the non-inverting input 148. It will be understood that conventional supply voltage connections (not shown) are also made to the amplifier 132.

In the operation of the transmitter 128, the charge on the timing capacitor 136 appearing at the tap point 138 is supplied to the inverting input 140 and compared by the operational amplifier 132 to the reference voltage appearing at the tap point 146. The actual reference voltage appearing at the tap point 146 depends not only upon the values of the voltage divider resistors 142 and 144, but upon the value of the positive feedback resistor 150 and upon the output voltage appearing at the operational amplifier output terminal 152. Depending upon whether the voltage at the inverting input 140 is higher or lower than the voltage at the non-inverting input 148, the operational amplifier output voltage is either near ground potential or near the positive DC supply voltage, and swings rapidly between these two voltages. As the output voltage swings between high and low values, the capacitor 136 alternately slowly charges and discharges and, at the same time, due to current flowing through the positive feedback resistor 150, the reference voltage supplied to the non-inverting input 148 abruptly increases and decreases to change the switching threshold of the operational amplifier 132, thereby sustaining oscillation.

As previously mentioned, the transmitter output terminal "T" is connected to the common transmitter pad 80 (FIGS. 3 and 4). In the absence of a person touching, for example, the touch pad 65, the square wave signal from the transmitter 128 is coupled through the capacitor formed by the transmitter pad 80 and the touch pad 65, and then coupled through the capacitor formed by the touch pad 65 and the receiver pad 78, thereby ultimately appearing on the R conductor 100.

Figure 7:
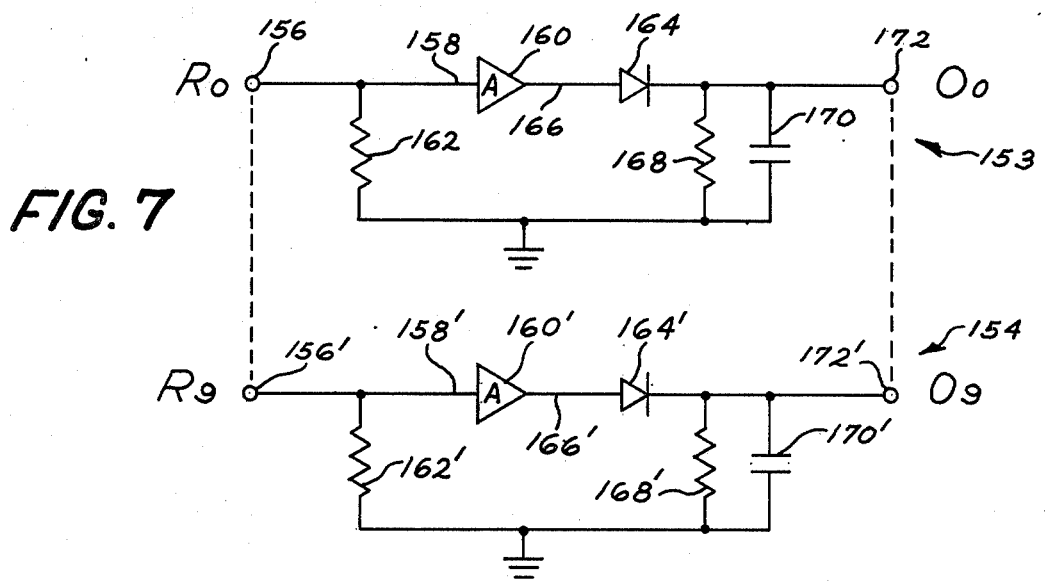
FIG. 7 is a schematic circuit diagram of an array of nine receivers which may be used in conjunction with the touch switch portion of a device according to the present invention.

Each of the various receiver pads in the device 30 is individually connected through an R conductor to the input of one of the ten receiver circuits of FIG. 7. For nomenclature purposes, hereinafter a subscript "0" refers to an element associated with the "OFF" position, a subscript "1" refers to an element associated with the "LO" position, and so on, up to subscript "9" which refers to an element associated with the "HI" position. The ten receiver circuits are all identical and have input lines designated $R_0$ through $R_9$ and output lines designated $O_0$ through $O_9$. FIG. 7 specifically shows only a first receiver circuit 153 connected to the receiver pad 88 associated with the "OFF" touch switch and a tenth receiver circuit 154 connected to a receiver pad 155 (FIG. 3) associated with the "HI" touch switch.

Considering exemplary receiver circuit 153 in detail, a circuit input terminal 156 is connected to the input 158 of a non-inverting buffer amplifier 160. A high resistance 162 is connected between the input 158 and ground to stabilize the system. A rectifying diode 164 is connected in series between the output 166 of the amplifier 160 and a parallel RC output network comprising a resistor 168 and a capacitor 170. This output network serves to rectify and smooth the output of the amplifier 160 to produce a positive DC voltage at the $O_0$ output terminal 172 when an AC input is supplied into the input terminal 156.

The receiver circuit 154 is identical in all respects to the circuit 153 and will not be further described. Various elements designated by primed reference numerals may be compared to like elements in the circuit 153.

In the operation of a complete touch switch system as thus far described, when exemplary touch pad 65 (FIGS. 3 and 4) is not being touched, output from the transmitter 128 is coupled through the transmitter pad 80, the touch pad 65, and the receiver pad 78 and into the input $R_8$ of the corresponding receiver (FIG. 6). A positive DC voltage appears at the receiver output terminal $O_8$. When the touch pad 65 is touched, human body capacitance shunts a significant portion of the square wave signal produced by the transmitter 128 to ground, resulting in a significant decrease in signal applied to the receiver input $R_8$ and a consequent decrease in voltage at the receiver output $O_8$. The signal appearing at the output terminal $O_8$ is thus an inverted logic signal. That is, it is a positive DC potential when the touch pad 65 is not being touched and is near ground potential when the touch pad 65 is being touched.

The receiver output lines $O_0$ through $O_9$ are connected to additional circuitry which will be described hereinafter with particular reference to FIGS. 9 and 10.

Figure 8:
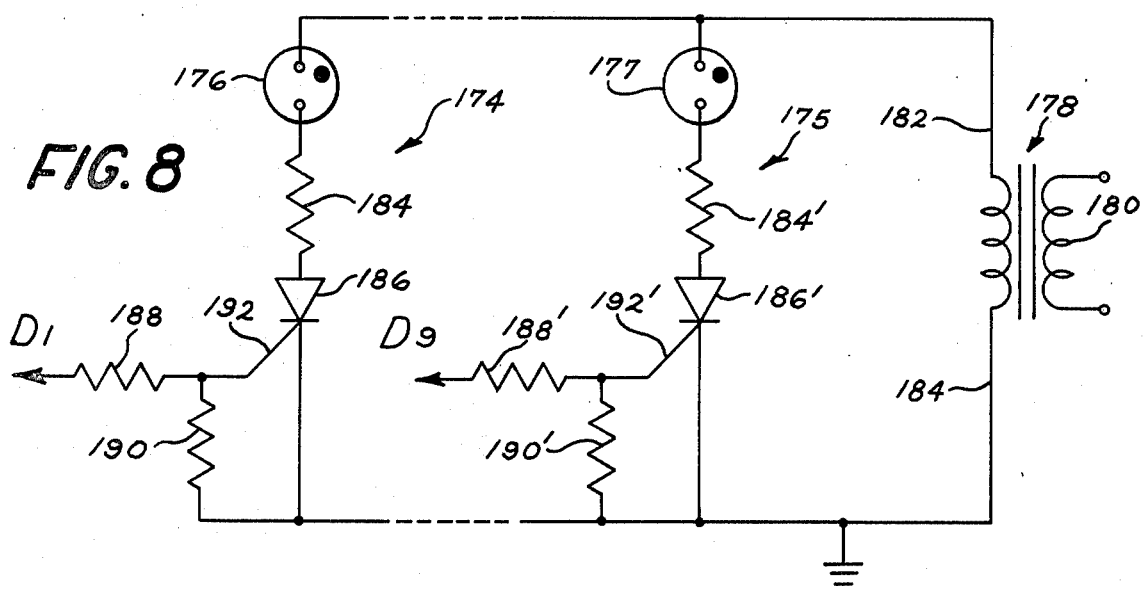
FIG. 8 is a schematic circuit diagram of an array of neon lamps and drivers which may comprise the display portion of a device according to the present invention.

Referring now to FIG. 8, there is shown circuitry for driving each of the nine display lamps in the array 44. Since the display drivers are all identical, only the first and the ninth are shown, these being designated 174 and 175. The two lamps 176 and 177 shown in FIG. 8 are the lamps which form a part of the "LO" and "HI" display segments 46 and 54 (FIGS. 2 and 3), respectively. In FIG. 8, a transformer 178 with its primary 180 connected to a suitable source of AC voltage supplies 120 volts AC across its output terminals 182 and 184. Each of the lamp and driver circuits is connected between the terminals 182 and 184 and thereby supplied with an AC voltage.

The exemplary circuit 174 comprises a current limiting resistor 184 and a silicon controlled rectifier (SCR) 186 connected in series relationship with the neon lamp 176. An input network comprising resistors 188 and 190 is connected to the gate terminal 192 of the SCR 186, the free end of the resistor 188 being connected to an input line $D_1$. Corresponding elements of the circuit 175 are designated by primed reference numerals.

In the operation of the exemplary circuit 174, when a positive voltage is supplied to the input terminal $D_1$ the SCR 186 is triggered into conduction, causing the neon lamp 186 to light. When the positive input voltage is removed, the SCR 186 ceases conducting and the lamp 176 is extinguished.

Figure 9:
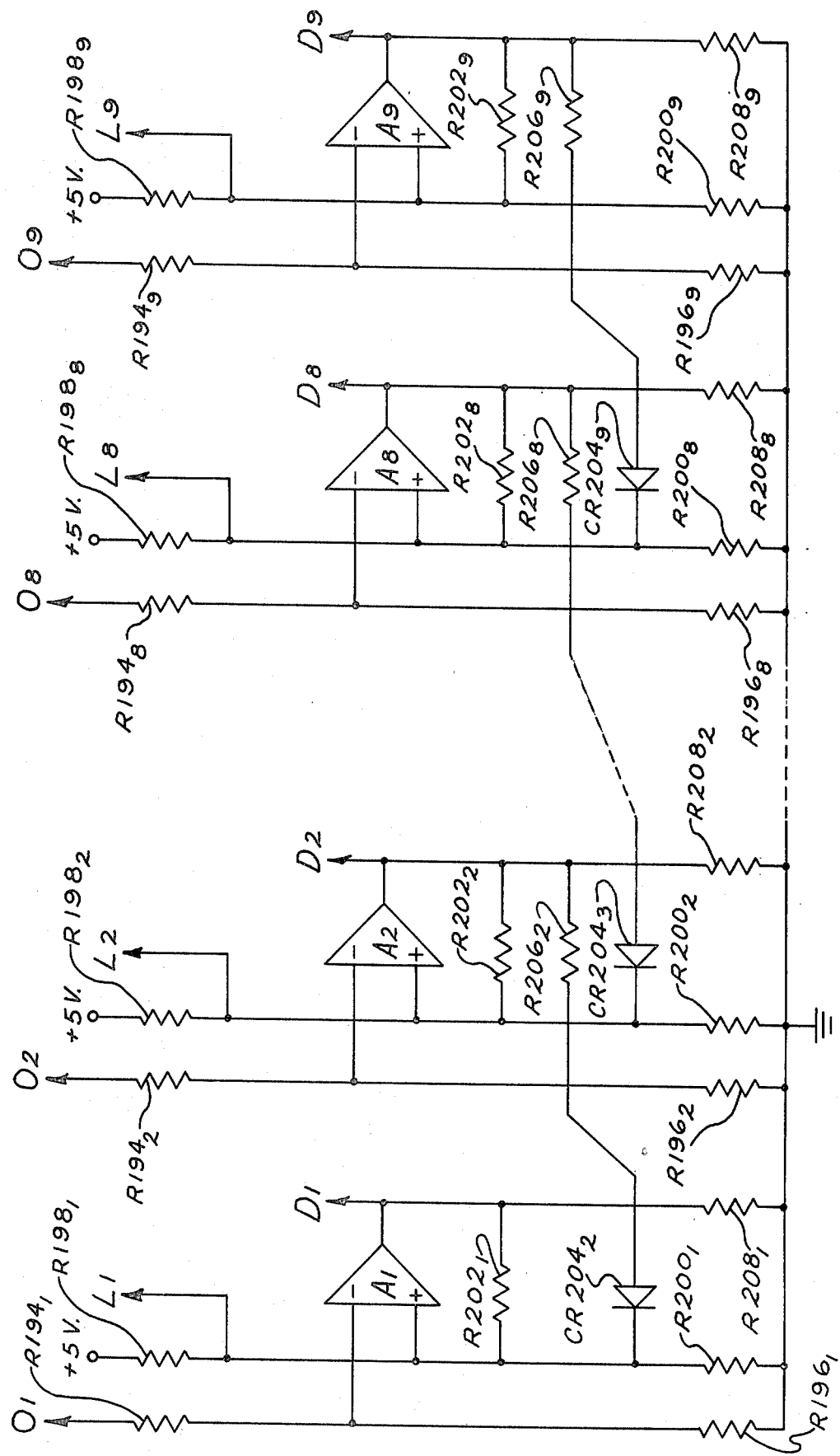
FIG. 9 is a portion of an exemplary logic circuit for receiving inputs and operating the display.
Figure 10:
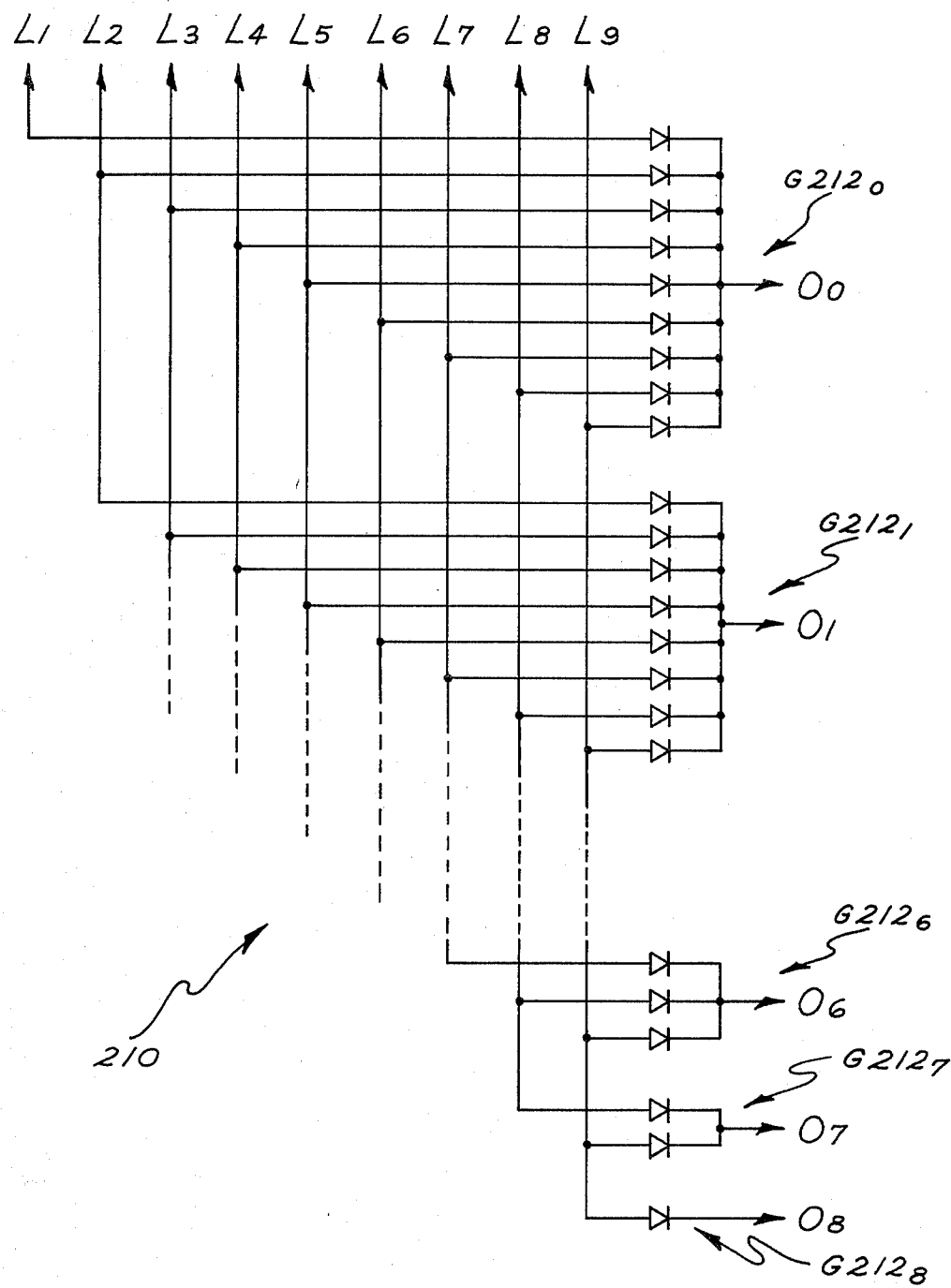
FIG. 10 is the remaining portion of the exemplary logic circuit.

Referring now to FIGS. 9 and 10, there is shown logic circuitry for receiving the output from the receivers along the lines $O_0$ through $O_9$ and for sending appropriate signals along the lines $D_1$ through $D_9$ to the lamp drivers (FIG. 8). Additionally, signals available on the "D" lines are connected to other circuitry (not shown) within the appliance for controlling the actual operation thereof.

The circuitry of FIG. 9 comprises nine individual circuit blocks, each circuit block being built around an operational amplifier connected as a voltage comparator, the nine amplifiers being designated $A_1$ through $A_9$. Although there is an $O_0$ line from the receiver circuit 153 associated with the "OFF" touch switch, there is no corresponding circuit block needed in FIG. 9. The remaining "O" lines, $O_1$ through $O_9$ are connected through input resistors $R194_1$ through $R194_9$ to the inverting (−) inputs of the respective amplifiers A1 through A9. Each of the input resistors R194 is associated with a lower resistor R196, forming a voltage divider therewith, to prevent the voltages applied to the inverting (−) inputs from overloading the amplifier inputs.

To establish a comparison voltage in each of the individual circuit blocks, each includes a reference voltage divider comprising a resistor R198 and a resistor R200 connected between a positive 5 VDC source and circuit ground. The resulting reference voltage is supplied to the non-inverting (+) input of each amplifier "A." Within each of the nine individual circuit blocks (with slight exceptions in the cases of $A_1$ and $A_9$), there are three additional contributions to the magnitude of the reference voltage. The first additional contribution is current flowing from the output terminal through the resistor R202 of each of the amplifiers to the reference voltage point at the (+) amplifier input. The resistors R202 are positive feedback resistors and introduce hysteresis to cause each of the nine individual circuit blocks to function as a latch. The second additional contribution to the reference voltage is current flowing from the diode matrix (FIG. 10) along the "L" lines to the reference voltage point. The third additional contribution is current flowing through latch up diodes CR204 and resistors R206 associated with succeeding circuit blocks. The amplifier $A_9$ has no latch up diode connected to its non-inverting (+) input since there is no succeeding circuit block. Lastly, each of the individual circuit blocks includes a stabilizing resistor R208 connected between the operational amplifier output and circuit ground.

The remaining part of the logic circuitry is the diode matrix 210 shown in FIG. 10. The diode matrix 210 comprises nine diode groups $G212_0$ through $G212_8$. The cathodes of all the diodes in each group are connected together and to one of the first nine "0" lines from the receiver outputs. Each succeeding diode group G212 includes one less diode than the preceding group. The diode anodes are connected to the "L" lines in the following manner: Each of the nine diodes in diode Group $G212_0$ is connected to one of the "L" lines. Each of the eight diode anodes in the diode group $G212_1$ is connected to one of the "L" lines $L_2$ through $L_9$, omitting $L_1$. The sequence continues until the last diode group $G212_8$ includes only a single diode with its anode connected to the line $L_9$, omitting $L_1$ through $L_8$.

The operation of this circuitry will be better understood if the functions it must perform are preliminarily mentioned. First, each of the individual circuit blocks must accept an inverted logic signal from a receiver circuit along an appropriate "0" line, indicating that a touch pad has been touched and, since a touch is only momentary, must "remember" through a latching action. Secondly, each of the nine circuit blocks must output a signal along an appropriate "D" line, both to a lamp driver (FIG. 8) and to other circuity (not shown) within the appliance. Thirdly, the circuitry must cause all the display segments to the left of the display segment associated with the touch pad which is touched to be energized, doing this by latching up all the lower circuit blocks in the chain. Fourthly, the circuitry must de-energize the display segments by unlatching the circuit blocks to the right or higher in the chain from the touch pad which is touched.

Now considering the operation, when a touch pad is touched, the corresponding "0" line from the receiver output goes low, pulling the inverting (−) input of the associated amplifier down below the reference potential supplied to the non-inverting (+) input. This causes the amplifier output to go high and, since the output of each amplifier as connected through a positive feedback resistor R202 back to the non-inverting (+) input, the potential on the non-inverting (+) input is raised sufficiently high to hold the amplifier in a latched-on condition, even when the voltage on the "0" line again rises as the touch is removed.

The output to the display drivers of FIG. 8 and to the additional circuitry (not shown) in the appliance is simply taken from the "D" lines connected to the outputs of the individual operational amplifiers "A."

In order to latch up lower circuit blocks in a chain when an intermediate touch pad, for example the "MED" touch area 62, is touched, a positive voltage flows from the output of the amplifier associated with the touch pad which is touched back through the resistor R206 and the diode CR204 to the non-inverting (+) input of the preceding amplifier "A," biasing the amplifier sufficiently to cause its output to go high. This sends a signal along the associated "D" line and, additionally, continues the chain backwards to latch up the next preceding amplifier block, continuing until amplifier $A_1$ is reached.

Lastly, in order to unlatch succeeding circuit blocks in a chain, the diode matrix (FIG. 10), receiving outputs directly from the various receivers of FIG. 7 along the "0" lines, supplies low logic state signals along the "L" lines directly to the non-inverting (+) inputs of the appropriate amplifiers "A." The low logic state signals are sufficient to overcome the positive voltage supplied through the positive feedback resistors R202 and therefore cause the succeeding amplifier circuits to unlatch.

The following table lists component values found suitable for the circuitry of FIGS. 6 through 10. It will of course be appreciated that the components are exemplary only and are included for the purpose of enabling one skilled in the art to practice the invention.

| Amplifiers | |
|---|---|
| 132 | National LM301A operational amplifier integrated circuit |
| 160 & 160' | part of RCA CD4050A cos/mos Hex Buffer integrated circuit |
| $A_1$ through $A_9$ | National LM301A |
| Diodes | |
| 164 & 164' | 1N4148 |
| 186 & 186' | General Electric C106B |
| CR204 | 1N4148 |
| In Groups G212 | 1N4148 |
| Capacitors | |
| 136 | 0.001 mfd. |
| 170 | 1 mfd. |
| Resistors | |
| 134 | 15K ohms |
| 142 | 100K ohms |
| 144 | 100K ohms |
| 150 | 100K ohms |
| 162 & 162' | 10 Meg ohms |
| 168 & 168' | 22 K ohms |
| 184 & 184' | 22 K ohms |
| 188 & 188' | 330 ohms |
| 190 & 190' | 1 K ohms |
| R194 | 1 Meg ohms |
| R196 | 680 K ohms |
| R198 | 1 Meg ohms |
| R200 | 1 Meg ohms |

| | |
|---|---|
| -continued | |
| R202 | 820 K ohms |
| R206 | 470 K ohms |
| R208 | 10 K ohms |

It will be apparent therefore that the present invention provides an improved input/output device which is extremely effective for control functions and easily understood by users, even those having a minimum of instructions.

While specific embodiments of the invention have been illustrated and described herein, it is realized that modifications and changes will occur to those skilled in the art. It is therefore to be understood that the appended claims are intended to cover all such modifications and changes as fall within the true spirit and scope of the invention.

What is claimed is:

1. A touch switch and display device comprising:
   a linear array of display segments strung out such that each segment is adjacent to no more than two other segments, said display segments adapted to be progressively energized to form a bar graph type display to represent a numerical quantity;
   a linear array of light transmitting touch sensitive areas superimposed over said linear array of display segments; and
   circuit means responsive to said touch sensitive areas and connected for energizing said display segments such that when any one of said touch sensitive areas is touched, a corresponding display segment and all display segments to one side are energized, and the remaining display segments are de-energized.

2. A device according to claim 1, wherein said touch sensitive areas are superimposed in a one-for-one relationship over said display segments.

3. A device according to claim 1, wherein said display segments are arranged in a straight line.

4. A touch control bar graph device comprising:
   a dielectric panel including a transparent window area;
   a linear array of light transmitting touch sensitive areas mounted on said panel over said window area, said array of touch sensitive areas being formed of a linear array of capacitive touch switches disposed on said panel, each of said touch switches including a transparent touch pad applied to the front side of said panel over said window area and a rear pad applied to the rear side of said panel in at least partially overlapping relationship with said touch pad so said touch pad and said rear pad form the two plates of a capacitor;
   a linear array of display segments mounted behind said panel and positioned so as to be visible through said window area, said array of display segments strung out such that each segment is adjacent to no more than two other segments, and said display segments adapted to be progressively energized to form a bar graph type display to represent a numerical quantity; and
   circuit means connected to said rear touch switch pads and responsive to said touch sensitive areas for driving said display segments such that when any one of said touch sensitive areas is touched, a corresponding display segment and all display segments to one side are energized, and the remaining display segments are de-energized.

* * * * *